(12) United States Patent
Yokobayashi et al.

(10) Patent No.: US 9,368,689 B2
(45) Date of Patent: Jun. 14, 2016

(54) LIGHT EMITTING ELEMENT

(71) Applicant: STANLEY ELECTRIC CO., LTD., Meguro-ku, Tokyo (JP)

(72) Inventors: Yusuke Yokobayashi, Tokyo (JP); Tatsuma Saito, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 83 days.

(21) Appl. No.: 14/062,795

(22) Filed: Oct. 24, 2013

(65) Prior Publication Data
US 2014/0110738 A1 Apr. 24, 2014

(30) Foreign Application Priority Data

Oct. 24, 2012 (JP) ................................. 2012-234555

(51) Int. Cl.
| H01L 33/00 | (2010.01) |
| H01L 33/40 | (2010.01) |
| H01L 33/44 | (2010.01) |
| H01L 33/14 | (2010.01) |
| H01L 33/20 | (2010.01) |

(52) U.S. Cl.
CPC ............ *H01L 33/405* (2013.01); *H01L 33/145* (2013.01); *H01L 33/20* (2013.01); *H01L 33/44* (2013.01); *H01L 33/0095* (2013.01)

(58) Field of Classification Search
CPC ........................................................ H01L 33/44
USPC ............................................................ 257/98
See application file for complete search history.

(56) References Cited

U.S. PATENT DOCUMENTS

| 7,659,553 | B2 | 2/2010 | Kato et al. | |
| 2002/0020842 | A1* | 2/2002 | Sasaki | H01L 33/14 257/79 |
| 2010/0032701 | A1* | 2/2010 | Fudeta | 257/98 |
| 2010/0065872 | A1* | 3/2010 | Lee | 257/98 |
| 2010/0219436 | A1* | 9/2010 | Watanabe | 257/98 |
| 2011/0062448 | A1* | 3/2011 | Hong | H01L 29/7787 257/76 |
| 2011/0220928 | A1* | 9/2011 | Muramoto | 257/94 |
| 2012/0037945 | A1* | 2/2012 | Kim et al. | 257/98 |
| 2012/0049230 | A1* | 3/2012 | Jeong | 257/98 |
| 2012/0305964 | A1* | 12/2012 | Akaike et al. | 257/98 |

FOREIGN PATENT DOCUMENTS

| JP | 11-220171 A | 8/1999 |
| JP | 2007-080899 A | 3/2007 |
| JP | 2007-335793 A | 12/2007 |

* cited by examiner

*Primary Examiner* — Matthew Landau
*Assistant Examiner* — Igwe U Anya
(74) *Attorney, Agent, or Firm* — Holtz, Holtz & Volek PC

(57) ABSTRACT

A light emitting element includes a semiconductor structure layer, a reflective electrode layer formed on a part of the semiconductor structure layer, a conductor layer formed on the semiconductor structure layer with the reflective electrode layer embedded therein, and a support substrate that is arranged on the conductor layer and joined to the conductor layer via a junction layer. A high resistance contact surface is provided at an interface between the semiconductor structure layer and the conductor layer. A high resistance portion is arranged in an area opposed via the conductor layer to an area where the high resistance contact surface is provided. The conductor layer is connected to the junction layer in a peripheral area of the conductor layer outside the high resistance portion.

21 Claims, 8 Drawing Sheets

LIGHT EMITTING ELEMENT

This application claims the priority benefit under 35 U.S.C. §119 of Japanese Patent Application No. 2012-234555 filed on Oct. 24, 2012, which is hereby incorporated in its entirety by reference.

TECHNICAL FIELD

The present invention relates to a light emitting element such as a light emitting diode (LED).

BACKGROUND ART

Light emitting elements such as an LED element have conventionally been used in light emitting apparatuses that are used for lighting, backlight, industrial equipment, and the like. Some such light emitting elements can include a reflective electrode layer made of Ag or the like, which is formed on a surface opposite to a light emission surface of a semiconductor structure layer including an active layer. Ag and other materials used for the reflective electrode layer are prone to electromigration. The electromigration refers to the diffusion and movement of Ag and the like in the LED element due to an electric field and/or a current flow. For such a reason, an anti-diffusion layer is formed around the reflective electrode layer (see Japanese Patent Application Laid-Open Nos. Hei. 11-220171, 2007-080899, and 2007-335793).

Low-profile high-output LED elements have been used recently. In such an LED element, a high current flowing into the element may diffuse the metal components forming the reflective electrode layer, such as Ag and Al, such that the metal components are pushed out along the surface of the semiconductor structure layer. This may reduce the density of the reflective electrode layer to lower the reflectance at the surface of the reflective electrode layer. In addition, the current density in the semiconductor structure layer becomes uneven, which reduces the emission efficiency of the light emitting element. The metal components can be diffused to and deposited on the side surfaces of the semiconductor structure layer, in which case the semiconductor structure layer is short-circuited to cause a lighting failure and the like of the light emitting element.

SUMMARY

The present invention was devised in view of these and other problems and features and in association with the conventional art. According to an aspect of the present invention, a light emitting element is provided in which the diffusion of a metal material forming a reflective electrode layer along the surface of a semiconductor structure layer is suppressed to prevent a drop in emission efficiency and improve reliability.

A light emitting element according to the present invention can include: a semiconductor structure layer; a reflective electrode layer that is formed on a part of the semiconductor structure layer; a conductor layer that is formed on the semiconductor structure layer so that the reflective electrode layer is embedded therein; a support substrate that is provided on the conductor layer and joined to the conductor layer with a junction layer interposed therebetween; a high resistance contact surface that is provided at an interface between the semiconductor structure layer and the conductor layer; and a high resistance portion that is provided in an area opposed via the conductor layer to an area where the high resistance contact surface is provided, wherein the conductor layer being connected to the junction layer in a peripheral area of the conductor layer outside the high resistance portion.

In the light emitting element as described above, the semiconductor structure layer can include a current inhibition portion that extends from the high resistance contact surface to inside.

In the light emitting element as described above, the high resistance portion can be a gap.

In the light emitting element as described above, an ohmic electrode layer can be formed between the reflective electrode layer and the semiconductor structure layer.

In the light emitting element as described above, the reflective electrode layer may extend to over the high resistance contact surface.

In this case, the reflective electrode layer may extend over the high resistance contact surface up to a position reaching an area between the high resistance contact surface and the high resistance portion.

The light emitting element as described above can be configured such that a distance between an inner edge and an outer edge of a connection surface between the conductor layer and the high resistance portion in the peripheral area of the conductor layer outside the high resistance portion is greater than a distance between a top surface of the high resistance portion and the high resistance contact surface.

The light emitting element as described above can further include an insulator that covers a side surface of the semiconductor structure layer and an end area of a surface of the semiconductor layer in contact with the conductor layer.

In the light emitting element of the aspect of the present invention, the junction layer can have a gap in an area opposed to an area where the high resistance contact surface is formed via the conductor layer.

In the light emitting element of the aspect of the present invention, the current inhibition portion can be formed by applying plasma processing to the semiconductor structure layer.

In the light emitting element of the aspect of the present invention, the conductor layer and the semiconductor structure layer may form a Schottky junction.

BRIEF DESCRIPTION OF DRAWINGS

These and other characteristics, features, and advantages of the present invention will become clear from the following description with reference to the accompanying drawings, wherein.

DESCRIPTION OF EXEMPLARY EMBODIMENTS

A description will now be made below to vehicle lights of the present invention with reference to the accompanying drawings in accordance with exemplary embodiments.

First Exemplary Embodiment

Figure 1:
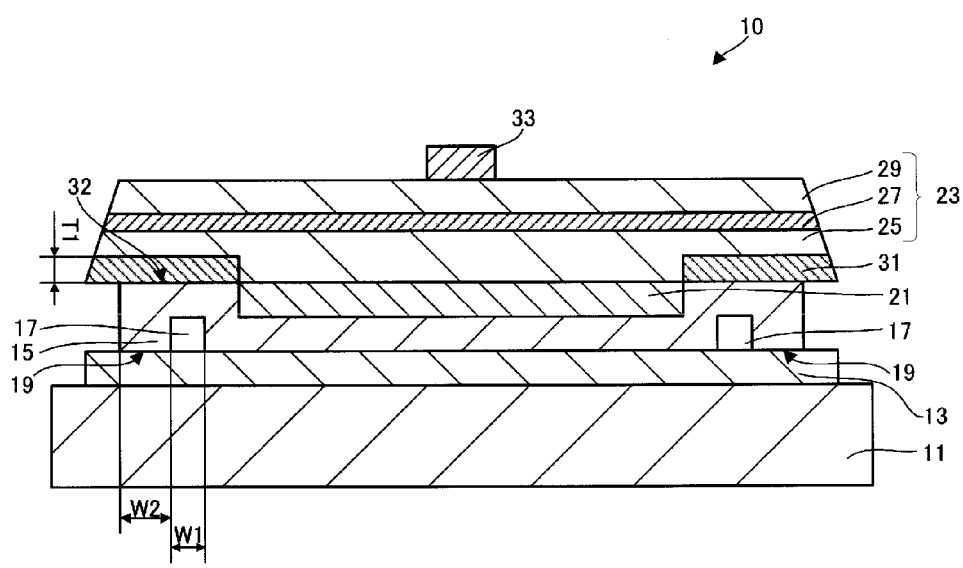
FIG. 1 is a cross-sectional view of a light emitting element according to a first exemplary embodiment of the present invention.
Figure 2:
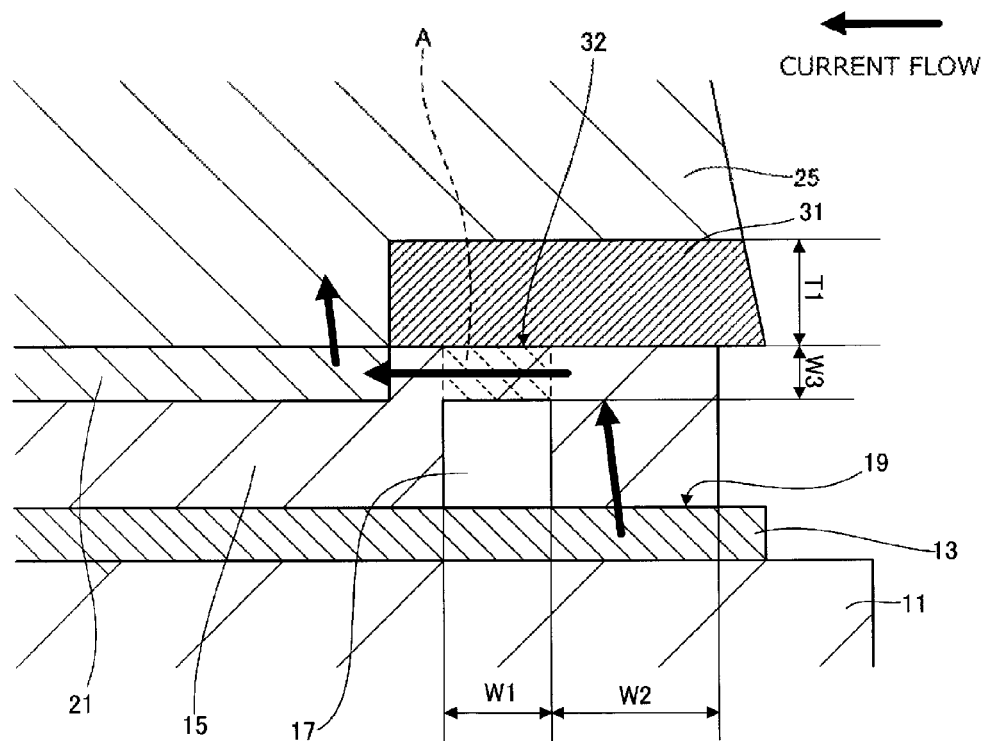
FIG. 2 is a partial enlarged view of the cross-sectional view of FIG. 1.

Referring to FIGS. 1 and 2, a light emitting element 10 according to a first exemplary embodiment of the present invention will be described below by using an LED element as an example. FIG. 1 is a cross-sectional view of the light emitting element 10 according to the first exemplary embodiment of the present invention. FIG. 2 is a partial enlarged view of a right end portion of the cross-sectional view of FIG. 1.

A support substrate 11 is a conductive substrate made of, for example, boron-doped Si. The support substrate 11 may be made of other materials having electrical conductivity and high thermal conductivity. Examples may include Ge, Al, Cu, and CuW. A metal film (not shown) intended to improve bonding characteristics for mounting the light emitting element 10 on a light emitting apparatus may be formed on the back side of the support substrate 11. For example, the metal film may be formed by stacking Ti, Pt, Au, and the like in order on the back surface of the support substrate 11.

A junction layer 13 is a metal layer formed by stacking Ti, Pt, and Au in order on the top surface of the support substrate 11. The junction layer 13 is joined to a conductive protection layer 15 above by the application of heat and pressure. The conductive protection layer 15 arranged on the junction layer 13 is a conductor layer joined to the junction layer 13. The conductive protection layer 15 is a metal layer including Au, Pt, Ti, and TiW stacked in order from the junction layer 13 side. In other words, the support substrate 11 is joined to the conductive protection layer 15 via the junction layer 13.

A high resistance portion 17 is formed in a peripheral area of the conductive protection layer 15. For example, the high resistance portion 17 is a tube-like space or gap formed by a recess of the conductive protection layer 15 and the junction layer 13 covering the opening. The high resistance portion 17 may be continuously formed along the periphery of the conductive protection layer 15. The high resistance portion 17 may be discretely formed in certain lengths. The high resistance portion 17 is an area having a resistance higher than that of the other portions of the conductive protection layer 15. A current from the junction layer 13 flows into the conductive protection layer 15 through the portions other than the high resistance portion 17. An electrical contact surface formed on the outermost periphery of the interface between the junction layer 13 and the conductive protection layer 15, lying outside the high resistance portion 17, will be referred to as a peripheral contact surface 19. The high resistance potion 17 has a width W1 of, for example, 5 μm. The peripheral contact surface 19 has a width W2 of, for example, 10 μm. The conductive protection layer 15 above the high resistance portion 17 has a thickness of, for example, 900 nm. The high resistance portion 17 may be filled with a material having a resistance higher than that of the materials forming the conductive protection layer 15. For example, the high resistance portion 17 may be filled with a high resistance material such as $SiO_2$ and SiN.

The conductive protection layer 15 has a recess which extends from the center of the top surface toward the edges of the conductive protection layer 15. A reflective electrode layer 21 is formed in the recess. The reflective electrode layer 21 is a metal layer made of metal having high light reflectivity, such as Ag. The reflective electrode layer 21 is arranged to fill the recess of the conductive protection layer 15. The top surface of the reflective electrode layer 21 forms a flat surface with the conductive protection layer 15. A semiconductor structure layer 23 is formed on the flat surface. In other words, the reflective electrode layer 21 is formed in contact with the surface of the semiconductor structure layer 23, and the conductive protection layer 15 is formed so that the reflective electrode layer 21 is embedded therein. The reflective electrode layer 21 serves to reflect light emitted from the semiconductor structure layer 23. The reflective electrode layer 21 also functions as a p electrode when supplying power to the semiconductor structure layer 23.

As described above, the semiconductor structure layer 23 is formed on the conductive protection layer 15 and the reflective electrode layer 21. The semiconductor structure layer 23 is configured so that a p-type semiconductor layer 25, an active layer 27, and an n-type semiconductor layer 29 are stacked from the reflective electrode layer 21 side. The p-type semiconductor layer 25 includes a p-type GaN layer and a p-type AlGaN layer. The active layer 27 has a multiple quantum well (MQW) structure. The n-type semiconductor layer 29 includes a strain relaxation layer including GaN/InGaN, an n-type GaN layer, an undoped GaN layer, and a GaN buffer layer. The undoped GaN layer and the GaN buffer layer are layers used to favorably grow the crystals of the semiconductor structure layer 23. As for the light emitting element 10, the undoped GaN layer and the GaN buffer layer may be removed by using a technique such as grinding, polishing, and reactive ion etching (RIE).

The p-type semiconductor layer 25 includes a current inhibition portion 31 extending into the inside of the p-type semiconductor layer 25 in the area which is in contact with the conductive protection layer 15. For example, the current inhibition portion 31 is formed by increasing the resistance of the area of the p-type semiconductor layer 25 in contact with the conductive protection layer 15 by plasma processing. The current inhibition portion 31 has a resistance higher than that of the other portions of the p-type semiconductor layer 25. The interface between the conductive protection layer 15 and the current inhibition portion 31 constitutes a high resistance contact surface 32. The high resistance contact surface 32 has a contact resistance higher than that of the interface between the reflective electrode layer 21 and the portion of the p-type semiconductor layer 25 where the current inhibition portion 31 is not formed. Consequently, the current flowing from the junction layer 13 into the conductive protection layer 15 flows into the p-type semiconductor layer 25 via the portions other than the current inhibition portion 31, i.e., without the intermediary of the high resistance contact surface 32. The p-type semiconductor layer 25 is formed in a thickness of, for example, 100 to 200 nm. The current inhibition portion 31 is formed to extend from the surface into the inside of the p-type semiconductor layer 25. For example, the p-type semiconductor layer 25 has a thickness T1 of 10 nm or greater. For reliable current inhibition, a thickness T1 of 50 nm or greater is desirable. The current inhibition portion 31 may be formed by applying ion implantation, reverse sputtering, and the like to the surface of the p-type semiconductor layer 25.

The active layer 27 is configured as a multiple quantum well (MQW), whereas it may be a single quantum well (SQW) or a single layer (so-called bulk layer). For example, the multiple quantum well structure includes five pairs of a well layer and a barrier layer, with an $In_xGa_{1-x}N$ layer (composition x=0.35; 2 nm in thickness) as the well layer and a GaN layer (14 nm in thickness) as the barrier layer. The composition x of the In in the well layers is adjusted within the range of $0<x\leq1.0$ according to the emission wavelength.

An n electrode 33 is formed on the n-type semiconductor layer 29 of the semiconductor structure layer 23. The n electrode 33 is formed by stacking Ti, Al, Ti, and Au in order on a part of the top surface of the n-type semiconductor layer 29.

FIG. 2 shows an enlarged view of the vicinity of the high resistance portion in FIG. 1. Thick arrows represent a current flowing in from the peripheral contact surface 19. As shown in FIG. 2, the light emitting element 10 includes the high resistance contact surface 32 which is formed by forming the current inhibition portion 31 in the area of the semiconductor structure layer 23 in contact with the conductive protection layer 15. The high resistance portion 17 is arranged at least in a part of the area opposed to the current inhibition portion 31 via the conductive protection layer 15. The high resistance portion 17 is formed by a recess of the conductive protection layer 15 and the junction layer 13 covering the opening. The peripheral contact surface 19 is formed outside the high resistance portion 17. With such a configuration, the light emitting element 10 produces a current flow toward the center of the light emitting element 10 in the end area of the conductive protection layer 15. Specifically, the current flows from the peripheral contact surface 19 into the conductive protection layer 15. The current passes through the area A (area enclosed by and diagonally hatched with broken lines) sandwiched between the high resistance portion 17 and the high resistance contact surface 32 formed by the current inhibition portion 31. The current then flows into the reflective electrode layer 21 and to the p-type semiconductor layer 25. In other words, a current path directed toward the inside of the light emitting element 10 along the interface between the conductive protection layer 15 and the semiconductor structure layer 23 is formed in the conductive protection layer 15.

The metal material of the reflective electrode layer 21 is being diffused toward the outside of the element along the interface between the conductive protection layer 15 and the semiconductor structure layer 23. The current flow toward the inside of the light emitting element 10 along the interface between the conductive protection layer 15 and the semiconductor structure layer 23 causes electromigration that moves such a metal material as if the metal material is pushed back toward the inside of the element.

In the light emitting element 10, the occurrence of the electromigration toward the inside of the element pushes back Ag, which is being diffused toward the outside of the element along the interface between the conductive protection layer 15 and the semiconductor structure layer 23, toward the inside of the element. As a result, the diffusion of the material forming the reflective electrode layer 21 toward the outside of the light emitting element 10 is suppressed. This prevents a drop in the emission efficiency of the light emitting element 10, a lighting failure of the light emitting element 10, and the like due to degradation of the reflective electrode layer 21. As a result, the reliability of the light emitting element 10 can be improved.

In the foregoing description, the high resistance portion 17 may be filled with a high resistance material. To raise the temperature near the interface between the conductive protection layer 15 and the semiconductor structure layer 23 to provide an environment for promoting electromigration, the high resistance portion 17 desirably has a high thermal resistance. Thus, the high resistance portion 17 is desirably left vacant.

To increase the current density in the area A to promote electromigration, the peripheral contact surface 19 desirably has an area greater than the cross-sectional area of the area A taken along the plane perpendicular to the current direction, i.e., the cross section perpendicular to the top surface of the support substrate 11 and perpendicular to the plane of FIG. 2. To satisfy such a condition, the peripheral contact surface 19 may have a width W2 greater than the thickness of the conductive protection layer 15. More specifically, the distance W2 between the inner edge and outer edge of the peripheral contract surface 19 may be greater than the distance W3 between the top surface of the high resistance portion 17 and the high resistance contact surface 32.

A method for manufacturing the foregoing light emitting element 10 will be described below with reference to FIGS. 3A to 3D. For the sake of clarity, FIGS. 3A to 3D show the cross sections of three light emitting elements. In actual manufacturing, an array of a large number of light emitting elements may be manufactured in a sheet-like configuration.

Figure 3A:
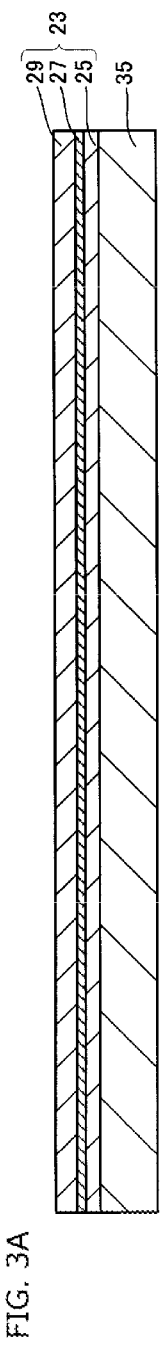
FIGS. 3A to 3D are diagrams showing manufacturing steps of the light emitting element of FIG. 1.

As shown in FIG. 3A, a growth substrate 35 such as a sapphire substrate is initially prepared. A semiconductor structure layer 23 is deposited by MOCVD. Specifically, for example, the growth substrate 35 is set in an MOCVD system. After thermal cleaning, an n-type semiconductor layer 29 including a GaN buffer layer, an undoped GaN layer, and an n-type GaN layer, an active layer 27, and a p-type semiconductor layer 25 including a p-type AlGaN layer and a p-type GaN layer are deposited in order. The growth substrate 35 on which the semiconductor structure layer 23 is deposited is then heated in an RTA apparatus at 700° C. for one minute to activate the p-type semiconductor layer 25.

Figure 3B:
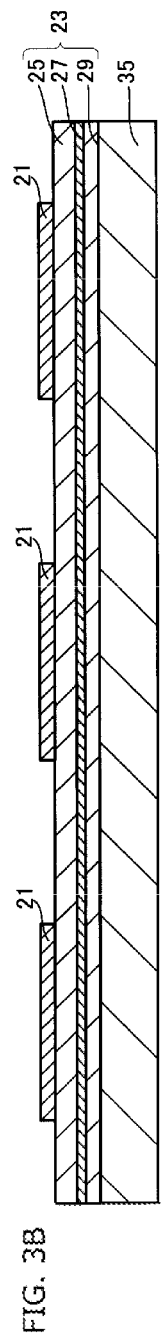

Next, as shown in FIG. 3B, reflective electrode layers 21 are deposited on the p-type semiconductor layer 25. Specifically, for example, an Ag layer for forming the reflective electrode layers 21 is deposited in a thickness of approximately 150 nm by using sputtering (for example, using a DC magnetron sputterer). A photoresist is applied to the surface of the formed Ag layer, and shaped into a desired pattern by using a photolithographic technique. By using an Ag etching solution (for example, an etchant formed by mixing nitric acid, water, acetic acid, and phosphoric acid in the ratio of 1:1:8:10), the Ag layer deposited on areas of the p-type semiconductor layer 25 where to form current inhibition portions 31 (or high resistance contact surfaces 32) is removed. The photoresist is removed to form the reflective electrode layers 21 of desired pattern. Finally, annealing is performed in an RTA apparatus to ensure ohmic contact between the reflective electrode layers 21 and the p-type semiconductor layer 25.

The deposition of the reflective electrode layers 21 is not limited to the foregoing sputtering method, and may be performed by using other techniques such as an electron beam (EB) method and a resistance heating method. The reflective electrode layers 21 may be formed by lift-off. The lift-off includes forming a photoresist on areas of the p-type semiconductor layer 25 where the reflective electrode layers 21 are not to be formed, then depositing an Ag layer, and removing the unnecessary portions of the Ag layer with the photoresist.

Next, current inhibition portions 31 are formed in the p-type semiconductor layer 25. Specifically, for example, plasma processing or reverse sputtering processing is performed on the p-type semiconductor layer 25 where the reflective electrode layers 21 are not formed. For example, the reverse sputtering processing is performed in an RF sputterer by using Ar gas as an inert gas, at an Ar gas flow rate of 50 sccm and power of 50 to 150 W for one to five minutes. The reverse sputtering processing makes the p-type semiconductor layer 25 partly nonconductive to form the current inhibition portions 31. The areas of the p-type semiconductor layer 25 subjected to the reverse sputtering become nonconductive. Note that the current inhibition portions 31 may be formed by performing ion implantation or other plasma processing using an RIE system or the like, on the surface of the p-type semiconductor layer 25.

Figure 3C:
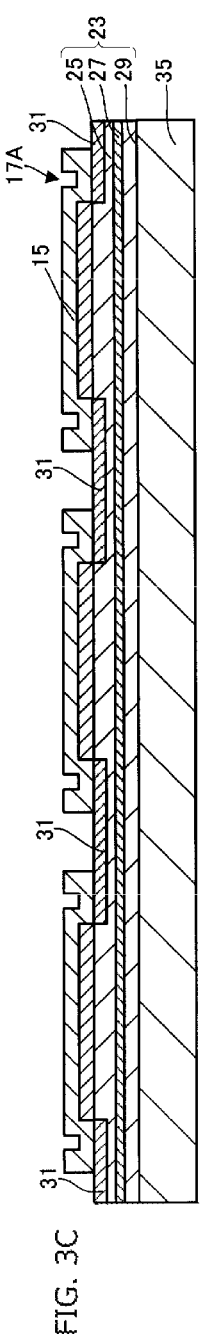

Next, as shown in FIG. 3C, conductive protection layers 15 are formed on the reflective electrode layers 21 and the surrounding p-type semiconductor layer 25 so as to cover the reflective electrode layers 21. Specifically, for example, a photoresist is applied onto the reflective electrode layers 21 and the p-type semiconductor layer 25. The photoresist is exposed and developed in a desired pattern. With the photoresist pattern left on the areas where the conductive protection layers 15 are not to be formed, TiW (250 nm in thickness), Ti (50 nm in thickness), Pt (100 nm in thickness), and Au (500 nm in thickness) are deposited and stacked in order by sputtering. The metals of the unnecessary portions are removed with the photoresist by lift-off. Using the same lift-off method as described above, Au is deposited in a thickness of 150 nm on the outer edges of the formed metal layers where to form the peripheral contact surfaces 19 with junction layers 13. This completes the conductive protection layers 15. The completed conductive protection layers 15 have recesses 17A to be the high resistance portions 17 near the ends. Like the reflective electrode layers 21, the deposition of the conductive protection layers 15 is not limited to the sputtering method, and may be performed by an EB method, a resistance heating method, or a combination of these. If the high resistance portions 17 are not to be left as a gap but to be filled with another material, the recesses 17A may be filled with a material having a resistance higher than that of the conductive protection layers 15 after the formation of the conductive protection layers 15. Examples of such a material may include $SiO_2$ and SiN.

Next, a support substrate 11 on which junction layers 13 are formed in positions corresponding to the surfaces of the conductive protection layers 15 is prepared. For example, the support substrate 11 is a Si substrate. The junction layers 13 are formed by stacking Ti (600 nm in thickness), Pt (50 nm in thickness), and Au (1000 nm in thickness) in order on the support substrate 11 by electron beam deposition or the like.

Figure 3D:
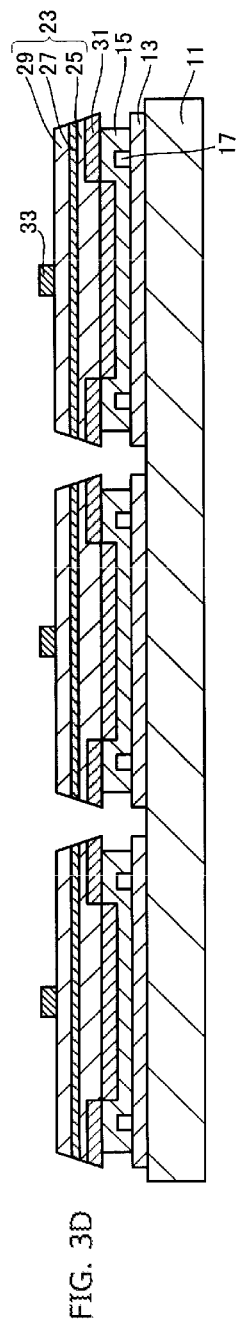

Next, with the surfaces of the junction layers 13 and the surfaces of the conductive protection layers 15 in contact with each other, thermocompression bonding is performed under a pressure of 30 kg/cm$^2$ at a temperature of 200° C. for one hour, whereby the support substrate 11 is bonded. Subsequently, for example, the back side of the growth substrate 35 is irradiated with excimer laser in a laser lift-off (LLO) system. This removes the growth substrate 35 as shown in FIG. 3D. The removal of the growth substrate 35 is not limited to laser lift-off (LLO), and may be performed by using wet etching, dry etching, mechanical polishing, chemical mechanical polishing (CMP), or a method combined with at least one of these methods.

If the growth substrate 35 is removed by LLO, Ga produced by the LLO is then removed by using hot water and the like. The GaN buffer layer and the undoped GaN layer of the n-type semiconductor layer 29 at the surface are removed by dry etching in an RIE system, whereby the n-type GaN layer is exposed. The resultant is then immersed into an alkali solution such as a tetramethylammonium hydroxide (TMAH) solution to form a hexagonal pyramidal structure on the surface of the exposed n-type GaN layer. The formation of the hexagonal pyramidal structure after the LLO may be performed by using any chemical agent as long as nitride semiconductors can be etched. Alkali solutions such as KOH and NaOH may be used.

After the end of the foregoing processing, a resist is formed on the areas of the semiconductor structure layer 23 where to form light emitting elements. In a dry etching system, the portions of the semiconductor structure layer 23 other than the areas where the resist is formed are removed to separate the semiconductor structure layer 23 into individual areas. The resist is then removed. As shown in FIG. 3D, n electrodes 33 are formed on the exposed n-type semiconductor layers 29. The n electrodes 33 are formed by depositing Ti (1 nm in thickness), Al (200 nm in thickness), Ti (1 nm in thickness), and Au (1000 nm in thickness) in order by electron beam deposition and the like. The n electrodes 33 may be made of material that can form an ohmic junction with an n-type semiconductor. Examples thereof may include AuGeNi, AuGe, AuSn, and AuSnNi. Finally, dicing is performed for element singulation, whereby the light emitting elements 10 are completed.

Second Exemplary Embodiment

Figure 4:
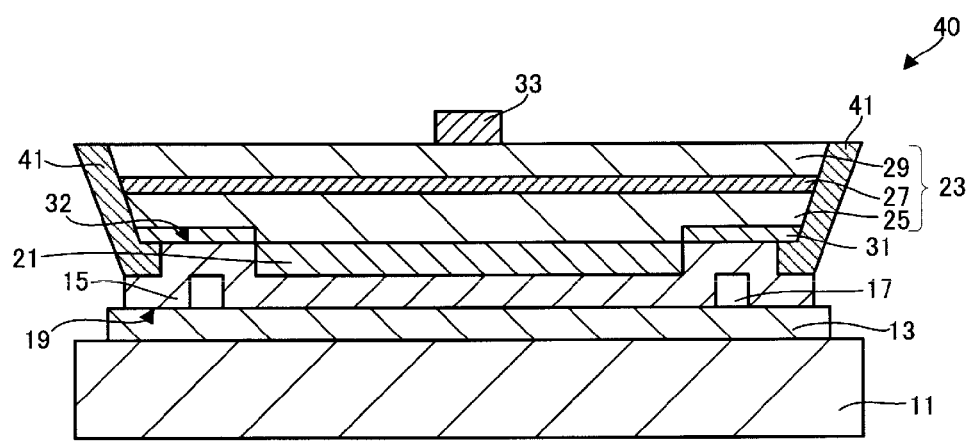
FIG. 4 is a cross-sectional view of a light emitting element according to a second exemplary embodiment of the present invention.

A light emitting element 40 according to a second exemplary embodiment of the present invention will be described below. As shown in FIG. 4, the light emitting element 40 has generally the same configuration as that of the light emitting element 10 except that the light emitting element 40 includes an insulating protection film made of an insulator which covers the side surfaces of the element. The insulating protection film 41 covers the entire side surfaces and the ends of the lower surface of the semiconductor structure layer 23. The insulating protection film 41 is made of an insulator such as $SiO_2$, and has a thickness of, for example, 150 nm.

Figure 5A:
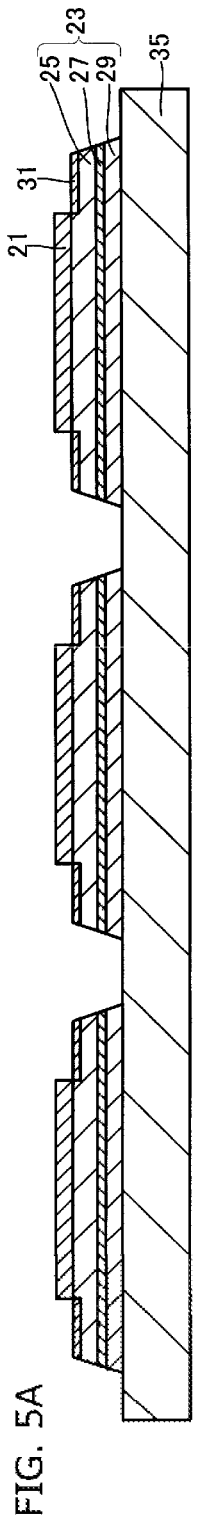
FIGS. 5A to 5C are diagrams showing manufacturing steps of the light emitting element of FIG. 4.
Figure 5B:
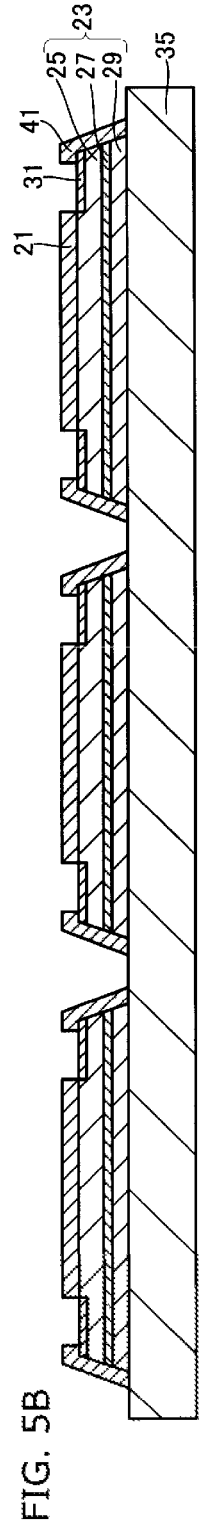

The insulating protection film 41 is formed after the reflective electrode layers 21 (for example, 150 nm in thickness) are formed, the current inhibition portions 31 are formed, and the semiconductor structure layer 23 is separated into individual areas as shown in FIG. 5A like the first exemplary embodiment. To separate the semiconductor structure layer 23 into individual areas, a resist is formed on the semiconductor structure layer 23 and the reflective electrode layers 21. In a dry etching system, the portions of the semiconductor structure layer 23 other than the areas where the resist is formed are removed to form grooves that reach the top surface of the growth substrate 35.

Figure 5C:
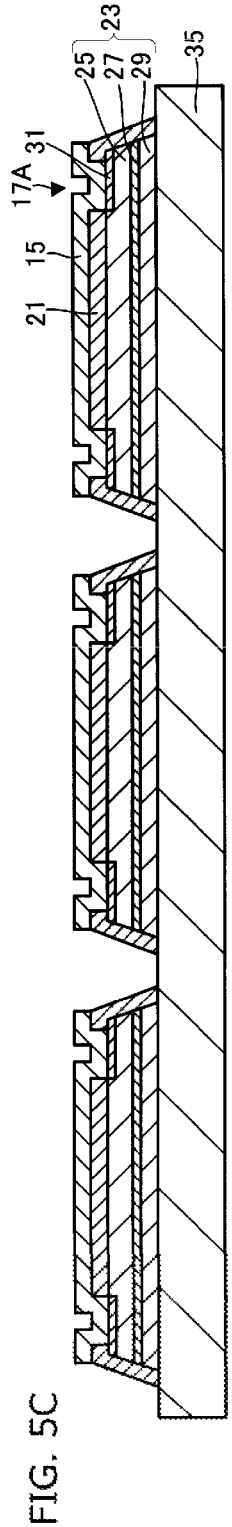

After the separation, insulating protection films 41 are formed, for example, by depositing $SiO_2$ on the side surfaces and the end areas (peripheral areas) of the top surfaces of the semiconductor structure layers 23 by sputtering. The insulating protection films 41 are deposited in the same thickness as that of the reflective electrode layers 21, i.e., 150 nm. To form high resistance portions, the insulating protection films 41 and the reflective electrode layers 21 are formed at a sufficient distance from each other (for example, separated by 5 μm). As shown in FIG. 5C, conductive protection layers 15 are formed by the same method as in the first exemplary embodiment so as to cover the insulating protection films 41 and the reflective electrode layers 21 formed on the top surfaces of the semiconductor structure layers 23.

As described above, in the light emitting element 40 according to the second exemplary embodiment, the conductive protection layer 15 is formed to cover the insulating protection film 41 and the reflective electrode layer 21. The insulating protection film 41 is formed on the ends of the top surface of the semiconductor structure layer 23 in the same thickness as that of the reflective electrode layer 21. Unlike the light emitting element 10 of the first exemplary embodiment, the high resistance portion 17 can be formed without the formation of an additional metal layer on the portion where to form the peripheral contact surface 19. This can simplify the manufacturing steps.

Third Exemplary Embodiment

Figure 6:
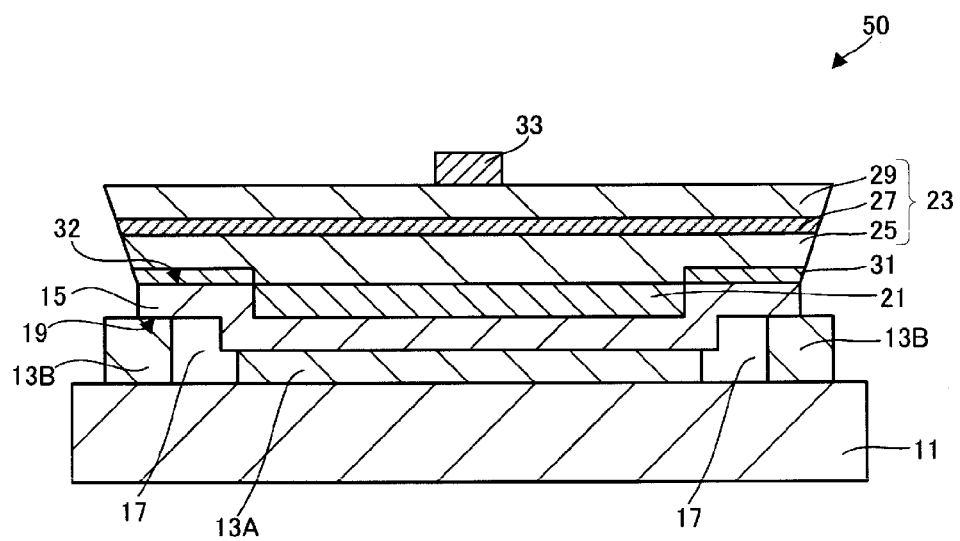
FIG. 6 is a cross-sectional view of a light emitting element according to a third exemplary embodiment of the present invention.

A light emitting element 50 according to a third exemplary embodiment of the present invention will be described below. As shown in FIG. 6, the light emitting element 50 has generally the same configuration as that of the light emitting element 10 except that there is an area where the junction layer 13 does not exist on the support substrate 11. In the light emitting element 50, the high resistance portion 17 is formed by partly providing an area where the junction layer 13 is not formed on the peripheral area of the support substrate 11.

In the light emitting element 50, the high resistance portion 17 is formed not by forming an additional metal layer on the portion where to form the peripheral contact surface 19 in the step of forming the conductive protection layer 15 of the light emitting element 10 according to the first exemplary embodiment. Instead, the high resistance portion 17 is formed by forming an inner junction layer 13A and a peripheral junction layer 13B on the support substrate 11. The peripheral junction layer 13B is formed at a distance from the inner junction layer 13A. In other words, in the light emitting element 50, the junction layer 13 is not formed in a part of the area opposed to the high resistance contact surface via the conductive protection layer 15, and the part is left as a gap. The peripheral junction layer 13B is formed to be thicker than the inner junction layer 13A as much as the thickness of the reflective electrode layer 21. The high resistance portion 17 is formed as an area that lies between the inner junction layer 13A and the peripheral junction layer 13B and is defined by the support substrate 11, the inner junction layer 13A, the peripheral junction layer 13B, and the conductive protection layer 15.

In the light emitting element 50, unlike in the light emitting element 10 of the first exemplary embodiment, such formation of the high resistance portion 17 eliminates the need to form an additional metal layer on the portion where to form the peripheral contact surface 19. This can simplify the manufacturing steps. The junction layer 13 and the conductive protection layer 15 may be made of metals prone to deformation during thermocompression, such as AuZn and AuSn. Even in such cases, the thicknesses of the inner junction layer 13A and the peripheral junction layer 13B and the distance therebetween can be increased, i.e., the size of the high resistance portion 17 can be increased to easily form the high resistance portion 17 without crushing. This can extend the range of choices for the materials of the junction layer 13 and the conductive protection layer 15.

Figure 7:
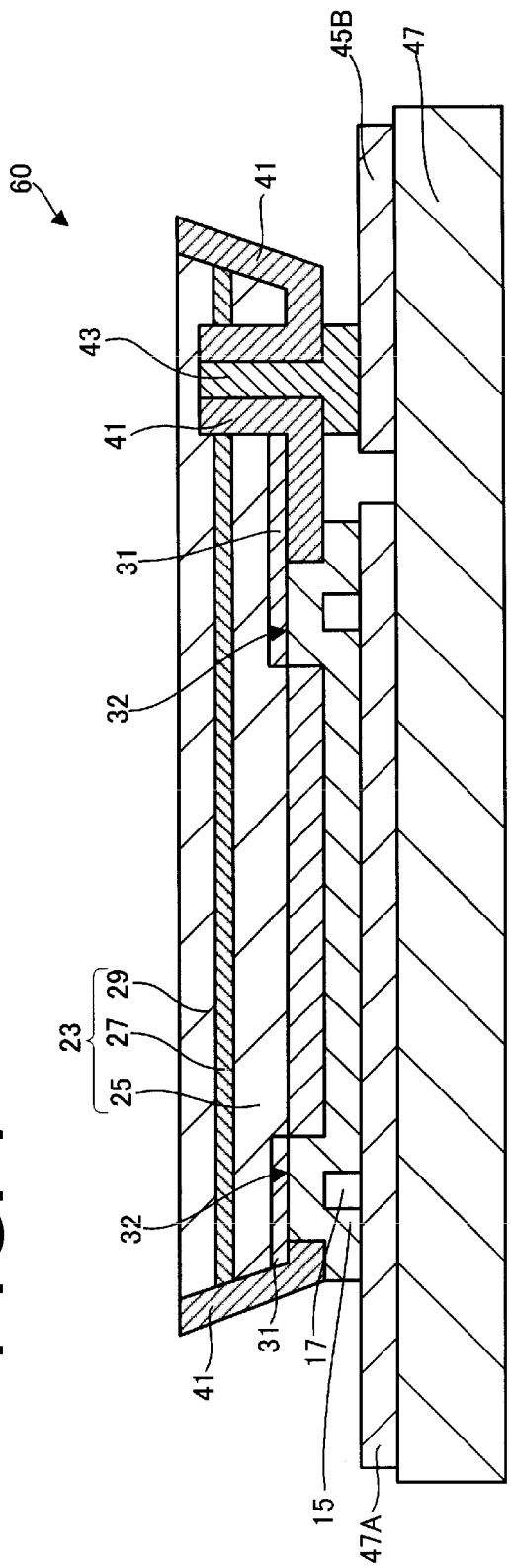
FIG. 7 is a cross-sectional view of a light emitting element according to a fourth exemplary embodiment of the present invention.

The foregoing exemplary embodiments have dealt with the light emitting elements of thin film type in which electrical connections are made on the top and bottom surfaces of the light emitting elements. However, the present invention is also applicable to a light emitting element of flip chip type in which electrical connections are made only on the bottom surface like a light emitting element 60 shown in FIG. 7. As shown in FIG. 7, the light emitting element 60 includes an n electrode 43 in one of the end areas (right in the diagram) of the semiconductor structure layer 23. The n electrode 43 extends from the p-type semiconductor layer 25 to the n-type semiconductor layer 29. The light emitting element 60 further includes a sub mount 47 having two wiring patterns 45A and 45B on its top surface. The wiring pattern 45A is in contact with and bonded to the conductive protection layer 15, and the wiring pattern 45B is in contact with and bonded to the n electrode 43, by thermocompression. The high resistance portion 17 is formed as a gap surrounded by the wiring pattern 45A and the conductive protection layer 15.

Figure 8:
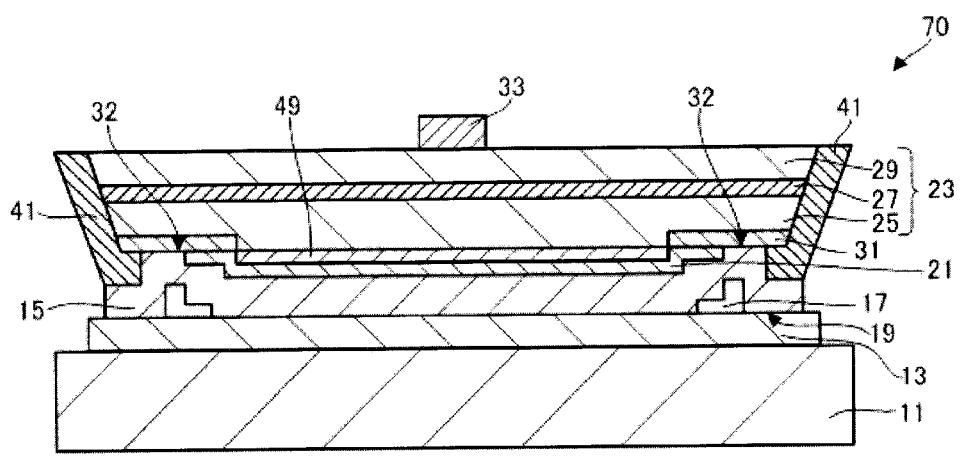
FIG. 8 is a cross-sectional view of a light emitting element according to another exemplary embodiment of the present invention.

Like a light emitting element 70 shown in FIG. 8, an ohmic electrode layer 49 may be formed between the reflective electrode layer 21 and the p-type semiconductor layer 25 of the foregoing light emitting elements. The ohmic electrode layer 49 is made of ITO or the like, has a low contact resistance with respect to the p-type semiconductor layer 25, and has higher affinity to metal than the p-type semiconductor layer 25. Such a configuration can reduce the contact resistance between the reflective electrode layer 21 and the p-type electrode layer 25 to improve the emission efficiency of the light emitting elements.

Since the reflective electrode layer 21 is deposited on the ohmic electrode layer 49, the ohmic electrode layer 49 can be formed before the formation of the current inhibition portion 31 and the deposition of the reflective electrode layer 21. The reflective electrode layer 21 can thus be formed to extend over the high resistance contact surface 32. As a result, the formation area of the reflective electrode layer 21 can be increased to reflect the light emitted from the active layer 27 more efficiently. This can improve the emission output of the light emitting element.

The high resistance portion 17 may also be formed in the areas opposed to the ends of the reflective electrode layer 21 formed on the current inhibition portion 31. In other words, the reflective electrode layer 21 may be extended over the high resistance contact surface 32 to positions reaching the areas between the high resistance contact surface 32 and the high resistance portion 17. This can form current paths toward the inside of the element even in the end areas of the reflective electrode layer 21. As a result, the diffusion of the material forming the reflective electrode layer 21 toward the outside of the element can be more effectively suppressed with a further improvement in the reliability of the light emitting element.

The ohmic electrode layer 49 may be a so-called transparent conductive film which has a low contact resistance with respect to the p-type semiconductor layer 25 and is transparent (has translucency). Examples of the material of the transparent conductive film may include ZnO, IZO, and AnNi alloys. Aside from the transparent conductive film, the ohmic electrode layer 49 may be a thin film of Ag, Pt, Rh, or the like which can make favorable electrical contact with the p-type semiconductor layer 25.

In the foregoing exemplary embodiments, the high resistance contact surface 32 is formed by forming the current inhibition portion 31 in the p-type semiconductor layer 25. However, the high resistance contact surface 32 may be formed by forming a Schottky junction between the p-type semiconductor layer 25 and the conductive protection layer 15. In such a case, the current inhibition portion 31 may be omitted.

In the foregoing exemplary embodiments, the conductive protection layer 15 is a metal layer formed by stacking Au, Pt, Ti, and TiW in order from the junction layer 13 side. However, a translucent conductive film having an optical refractive index lower than that of the p-type semiconductor layer 25 may be added to the surface of the conductive protection layer 15 in contact with the p-type semiconductor layer 25. Examples of the material of the translucent conductive film may include ITO, IZO, and ZnO. The interface between the translucent conductive film and the p-type semiconductor layer can totally reflect light to reduce the light that reaches and is absorbed by the metal layer. This can further improve the emission output of the light emitting element.

In the foregoing exemplary embodiments, the reflective electrode layer 21 is formed as a single-layer film of Ag. However, the reflective electrode layer 21 may be made of a material such as an Ag alloy, Al, and an Al alloy which have high light reflectance. The reflective electrode layer 21 may be a multilayer film instead of a single-layer film. The multilayer film may be formed by stacking an extremely thin (for example, 5 nm or less) adhesive layer of Ti, Ni, or the like on either one or both of the top and bottom surfaces of the foregoing film made of Ag, an Ag alloy, Al, an Al alloy, or the like.

Various numerical values, sizes, materials, and the like in the foregoing exemplary embodiments are just an example, and may be selected as appropriate according to the intended use, the used light emitting element, etc.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light emitting element comprising:
a semiconductor structure layer;
a reflective electrode layer that is formed on a part of the semiconductor structure layer;
a conductor layer that is formed on the semiconductor structure layer so that the reflective electrode layer is embedded therein;
a support substrate that is provided on the conductor layer and joined to the conductor layer with a junction layer interposed therebetween;
a high resistance contact surface that is provided at an interface between the semiconductor structure layer and the conductor layer; and
a high resistance portion that is provided in an area directly opposed, via the conductor layer, to an area where the high resistance contact surface is provided in a direction substantially perpendicular to the high resistance contact surface, the conductor layer being connected to the junction layer in a peripheral area of the conductor layer outside the high resistance portion.

2. The light emitting element according to claim 1, wherein the semiconductor structure layer includes a current inhibition portion that extends from the high resistance contact surface to inside.

3. The light emitting element according to claim 2, wherein the high resistance portion is a gap.

4. The light emitting element according to claim 3, wherein an ohmic electrode layer is formed between the reflective electrode layer and the semiconductor structure layer.

5. The light emitting element according to claim 4, wherein the reflective electrode layer extends to over the high resistance contact surface.

6. The light emitting element according to claim 5, wherein the reflective electrode layer extends over the high resistance contact surface up to a position reaching an area between the high resistance contact surface and the high resistance portion.

7. The light emitting element according to claim 2, wherein an ohmic electrode layer is formed between the reflective electrode layer and the semiconductor structure layer.

8. The light emitting element according to claim 7, wherein the reflective electrode layer extends to over the high resistance contact surface.

9. The light emitting element according to claim 8, wherein the reflective electrode layer extends over the high resistance contact surface up to a position reaching an area between the high resistance contact surface and the high resistance portion.

10. The light emitting element according to claim 2, wherein the current inhibition portion is formed by applying plasma processing to the semiconductor structure layer.

11. The light emitting element according to claim 1, wherein the high resistance portion is a gap.

12. The light emitting element according to claim 11, wherein an ohmic electrode layer is formed between the reflective electrode layer and the semiconductor structure layer.

13. The light emitting element according to claim 12, wherein the reflective electrode layer extends to over the high resistance contact surface.

14. The light emitting element according to claim 13, wherein the reflective electrode layer extends over the high resistance contact surface up to a position reaching an area between the high resistance contact surface and the high resistance portion.

15. The light emitting element according to claim 1, wherein an ohmic electrode layer is formed between the reflective electrode layer and the semiconductor structure layer.

16. The light emitting element according to claim 15, wherein the reflective electrode layer extends to over the high resistance contact surface.

17. The light emitting element according to claim 16, wherein the reflective electrode layer extends over the high resistance contact surface up to a position reaching an area between the high resistance contact surface and the high resistance portion.

18. The light emitting element according to claim 1, wherein a distance between an inner edge and an outer edge of a connection surface between the conductor layer and the junction layer in the peripheral area of the conductor layer outside the high resistance portion is greater than a distance between a top surface of the high resistance portion and the high resistance contact surface.

19. The light emitting element according to claim 1, further comprising an insulator that covers a side surface of the semiconductor structure layer and an end area of a surface of the semiconductor layer in contact with the conductor layer.

20. The light emitting element according to claim 1, wherein the high resistance contact surface is a surface formed of a Schottky junction between the conductor layer and the semiconductor structure layer.

21. A light emitting element comprising:
a semiconductor structure layer;
a reflective electrode layer that is formed on a part of the semiconductor structure layer;
a conductor layer that is formed on the semiconductor structure layer so that the reflective electrode layer is embedded therein;
a support substrate that is provided on the conductor layer and joined to the conductor layer with a junction layer interposed therebetween;

a high resistance contact surface that is provided at an interface between the semiconductor structure layer and the conductor layer; and a high resistance portion that is provided in an area opposed via the conductor layer to an area where the high resistance contact surface is provided, wherein the conductor layer is connected to the junction layer in a peripheral area of the conductor layer outside the high resistance portion, and wherein the junction layer has a gap in an area opposed to an area where the high resistance contact surface is formed via the conductor layer.

* * * * *